(12) United States Patent
Lien et al.

(10) Patent No.: US 12,417,808 B2
(45) Date of Patent: Sep. 16, 2025

(54) SINGLE-LEVEL CELL PROGRAMMING WITH ADAPTIVE WORDLINE RAMP RATE

(71) Applicant: Micron Technology, Inc., Boise, ID (US)

(72) Inventors: Yu-Chung Lien, San Jose, CA (US); Joshua Garrison, Folsom, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 147 days.

(21) Appl. No.: 18/496,660

(22) Filed: Oct. 27, 2023

(65) Prior Publication Data
US 2024/0170071 A1    May 23, 2024

Related U.S. Application Data

(60) Provisional application No. 63/427,151, filed on Nov. 22, 2022.

(51) Int. Cl.
| | |
|---|---|
| G11C 13/00 | (2006.01) |
| G11C 16/08 | (2006.01) |
| G11C 16/10 | (2006.01) |
| G11C 16/34 | (2006.01) |

(52) U.S. Cl.
CPC ............ G11C 16/102 (2013.01); G11C 16/08 (2013.01); G11C 16/349 (2013.01)

(58) Field of Classification Search
CPC .................................................. G11C 13/0064
See application file for complete search history.

(56) References Cited

U.S. PATENT DOCUMENTS

2011/0214025 A1 * 9/2011 Seko ................... G11C 13/0064
                                                                  714/720

\* cited by examiner

*Primary Examiner* — Jason Lappas
(74) *Attorney, Agent, or Firm* — Lowenstein Sandler LLP

(57) ABSTRACT

A processing device is operatively coupled to an array of memory cells. The processing device determines that a media endurance metric value for a string of the array of memory cells satisfies a first threshold criterion based on a first threshold value. The processing device further controls, based on the media endurance metric value, a ramp rate of a program pulse applied to a wordline of the string.

20 Claims, 9 Drawing Sheets

Default Ramp Rate 410 > First Ramp Rate 420 >
Second Ramp Rate 430 > Third Ramp Rate 440

SINGLE-LEVEL CELL PROGRAMMING WITH ADAPTIVE WORDLINE RAMP RATE

RELATED APPLICATIONS

This application claims the benefit of U.S. Provisional Patent Application No. 63/427,151 filed Nov. 22, 2022, the entire contents of which are incorporated by reference herein.

TECHNICAL FIELD

Embodiments of the disclosure relate generally to memory sub-systems, and more specifically, relate to single-level cell (SLC) programming with adaptive wordline ramp rate.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1A:
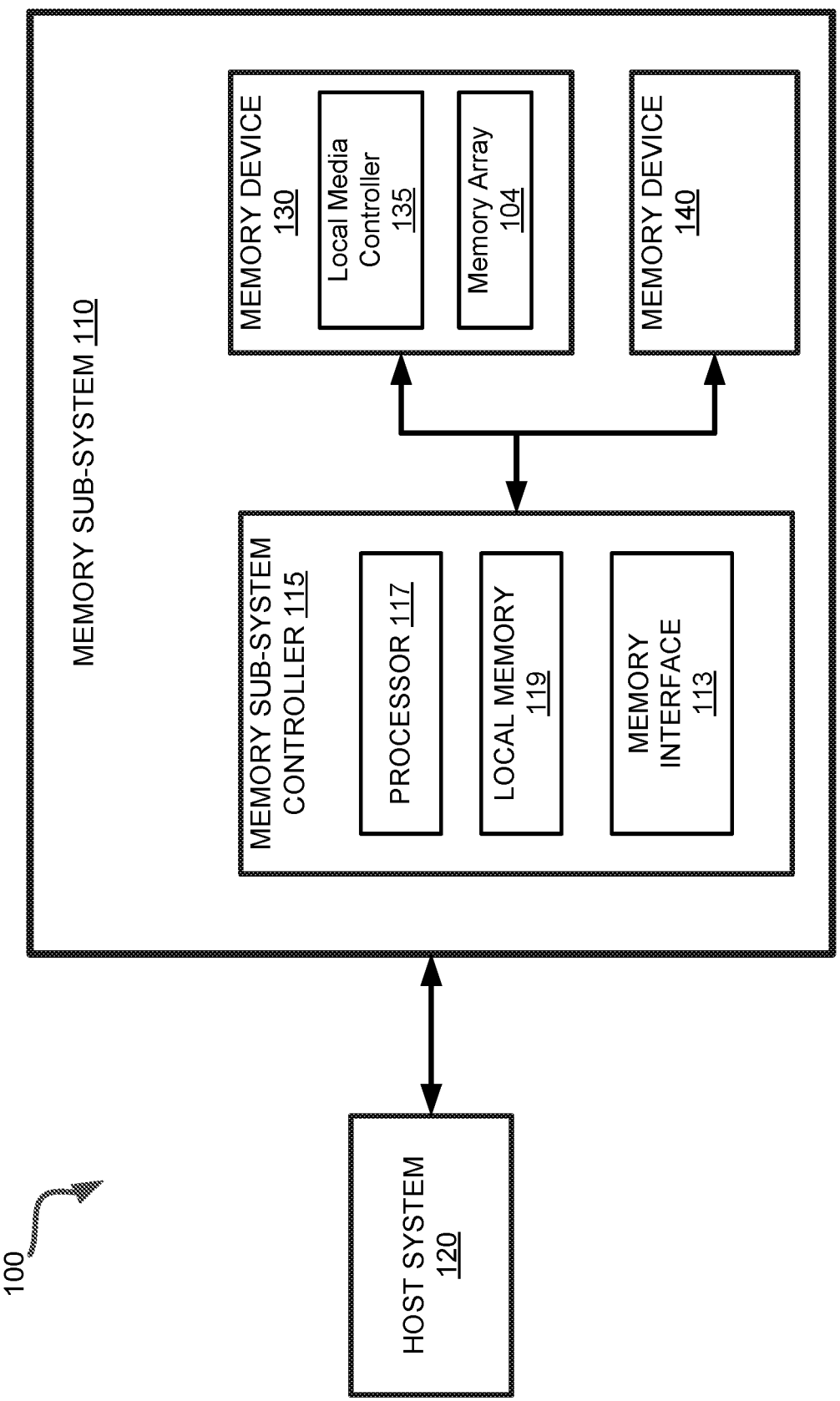
FIG. 1A illustrates an example computing system that includes a memory sub-system in accordance with some embodiments of the present disclosure.

Aspects of the present disclosure are directed to single-level cell (SLC) programming with adaptive wordline ramp rate. A memory sub-system can be a storage device, a memory module, or a hybrid of a storage device and memory module. Examples of storage devices and memory modules are described below in conjunction with FIGS. 1A-B. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. For example, NOT-AND (NAND) memory, such as 3D flash NAND memory, offers storage in the form of compact, high-density configurations. A non-volatile memory device is a package of one or more dice, each including one or more planes. For some types of non-volatile memory devices (e.g., NAND memory), each plane includes of a set of physical blocks. Each block includes of a set of pages. Each page includes of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can include multiple memory cells arranged in a two-dimensional or a three-dimensional grid. The memory cells are formed onto a silicon wafer in an array of columns and rows. A wordline is a conductive line coupled to one or more rows of memory cells of a memory device. A bitline is a conductive line coupled to one or more columns of memory cells. The intersection of a bitline and wordline constitutes the address of the memory cell. A block refers to a unit of the memory device used to store data and can include a group of memory cells, a wordline group, a wordline, or individual memory cells. One or more blocks can be grouped together to form separate partitions (e.g., planes) of the memory device in order to allow concurrent operations to take place on each plane.

During a program operation of a non-volatile memory device, a memory sub-system controller (e.g., processing device) directs the program operation in certain phases, including program and program verify phases. For example, the controller causes a high program voltage pulse to be applied to a selected wordline of a block of the memory device during a program phase, followed by a program verify phase, during which the controller causes a verify voltage to be applied to the selected wordline. Alternatively, multiple program voltage pulses can be applied to the selected wordline of a block of the memory device during the program phase, followed by a program verify phase, in which the controller causes a verify voltage to be applied to the selected wordline.

In certain memory devices, a memory configured as SLC memory may have two different trim settings during program operations. A static trim setting employs two program pulses and one program verify pulse, giving the SLC memory the advantage of higher endurance but has slower performance (e.g., time to program). The dynamic trim setting has one program pulse and one program verify pulse and gives the SLC memory better performance (e.g., time to program) but has less endurance, e.g., fewer program/erase cycles (PECs). The lack of endurance shortens the life of the SLC memory. Further, the lack of performance increases the length of the program operation, which can be especially impactful in high-priority and time-sensitive operations, such as SLC program operations.

Figure 4:
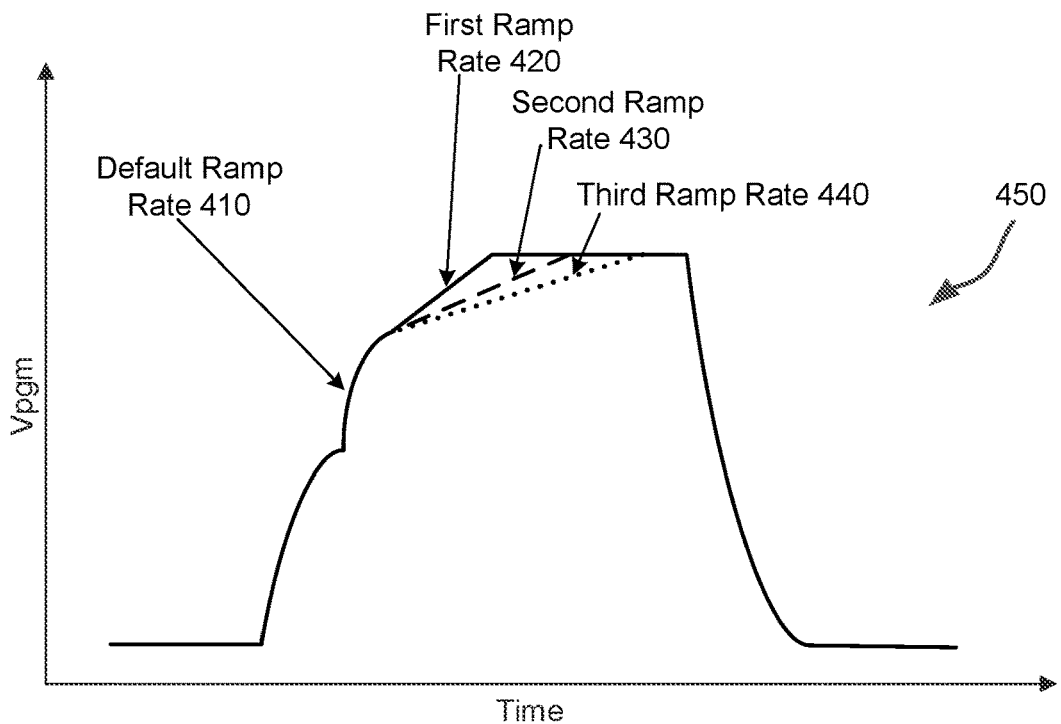
FIG. 4 is a graph of a program pulse with different ramps rates for a wordline of a string of an array of memory cells, in accordance with some embodiments of the present disclosure.

Aspects of the present disclosure address the above and other deficiencies by implementing SLC programming with an adaptive wordline ramp rate. In SLC programming with adaptive wordline ramp rate, the controller (e.g., a processing device) can program memory cells using different programming pulse ramp rates depending on a media endurance metric value. "Ramp rate" refers to the rate of change of the voltage level of a program pulse. For example, ramp rate may be depicted in graphical form, as shown in FIG. 4, as the slope of the leading edge of a program pulse 450.

In one embodiment, a processing device in a system is operatively coupled to an array of memory cells configured as SLC memory. In embodiments, the processing device determines that a media endurance metric value (e.g., a program/erase cycle (PEC) value, write amplification, or a combination thereof) for a subset of memory cells of the array of memory cells satisfies a threshold criterion (e.g., exceeds a certain threshold value). For example, the subset of memory cells may include a string (e.g., a series of connected memory cells in which the source of one cell is connected to the drain of the next one), a sub-block, or a physical block of memory cells. The PEC value and any additional write amplification (e.g., the write amplification caused by performing a refresh of data to rectify drifting threshold voltage levels) may be tracked from the time the memory device is put into operation. In some embodiments, the media endurance metric value satisfies the threshold criterion when the media endurance metric value is greater than or equal to a certain threshold value. For example, a threshold value may be determined based on statistical data collected in post-production testing, such that the determined threshold value would optimize chosen performance or endurance metric(s). The processing device may further control a ramp rate of a program pulse applied to a wordline addressing the subset of memory cells based on the media endurance value. In varied embodiments, the processing device can apply different granular levels of ramp rates to such wordlines depending on whether the media endurance value of the subset of memory cells meets corresponding granular levels of media endurance metric values, as will be discussed in more detail.

In some embodiments, the processing device may further adjust, based on the media endurance value, the voltage of a program pulse applied to a wordline addressing the subset of memory cells. In varied embodiments, the processing device can apply, depending on whether the media endurance value of the subset of memory cells meets corresponding granular levels of threshold values, different granular levels of program voltage to such wordlines, as will be discussed in more detail.

Advantages of this approach include, but are not limited to, improved SLC programming performance in the memory device. The SLC programming operation with an adaptive wordline ramp rate described herein allows for higher endurance in SLC memory devices and improved performance (time to program) during programming operations at the memory devices. By achieving this performance-endurance balance, the present embodiments facilitate extending the life of SLC memory devices while maintaining high performance at the BOL and high reliability at the end of life (EOL) of the memory devices. Further, cycling degradation is alleviated for memory devices using the disclosed adaptive wordline ramp rate. For example, performance without significant cycling degradation can be achieved at higher media endurance metric values (e.g., PEC values) than can be when typical SLC programming is implemented.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory modules (NVDIMMs).

The computing system 100 can be a computing device such as a desktop computer, laptop computer, network server, mobile device, a vehicle (e.g., airplane, drone, train, automobile, or other conveyance), Internet of Things (IOT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130, 140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single-level cells (SLC) can store one bit per cell. Other types of memory cells, such as multi-level cells (MLCs), triple level cells (TLCs), quad-level cells (QLCs) and penta-level (PLCs), can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, and an MLC portion, a TLC portion, a QLC portion or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as a 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., a processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device 130 having control logic (e.g., local controller 135) on the die and a controller (e.g., memory sub-system controller 115) for media management within the same memory device package. An example of a managed memory device is a managed NAND (MNAND) device. Memory device 130, for example, can represent a single die having some control logic (e.g., local media controller 135) embodied thereon. In some embodiments, one or more components of memory sub-system 110 can be omitted.

In one embodiment, memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. In some embodiments, the memory sub-system controller 115 includes at least a portion of the memory interface 113. For example, the memory sub-system controller 115 can include a processor 117 (e.g., a processing device) configured to execute instructions stored in local memory 119 for performing the operations described herein. In some embodiments, the memory interface component 113 is part of the host system 110, an application, or an operating system.

Figure 1B:
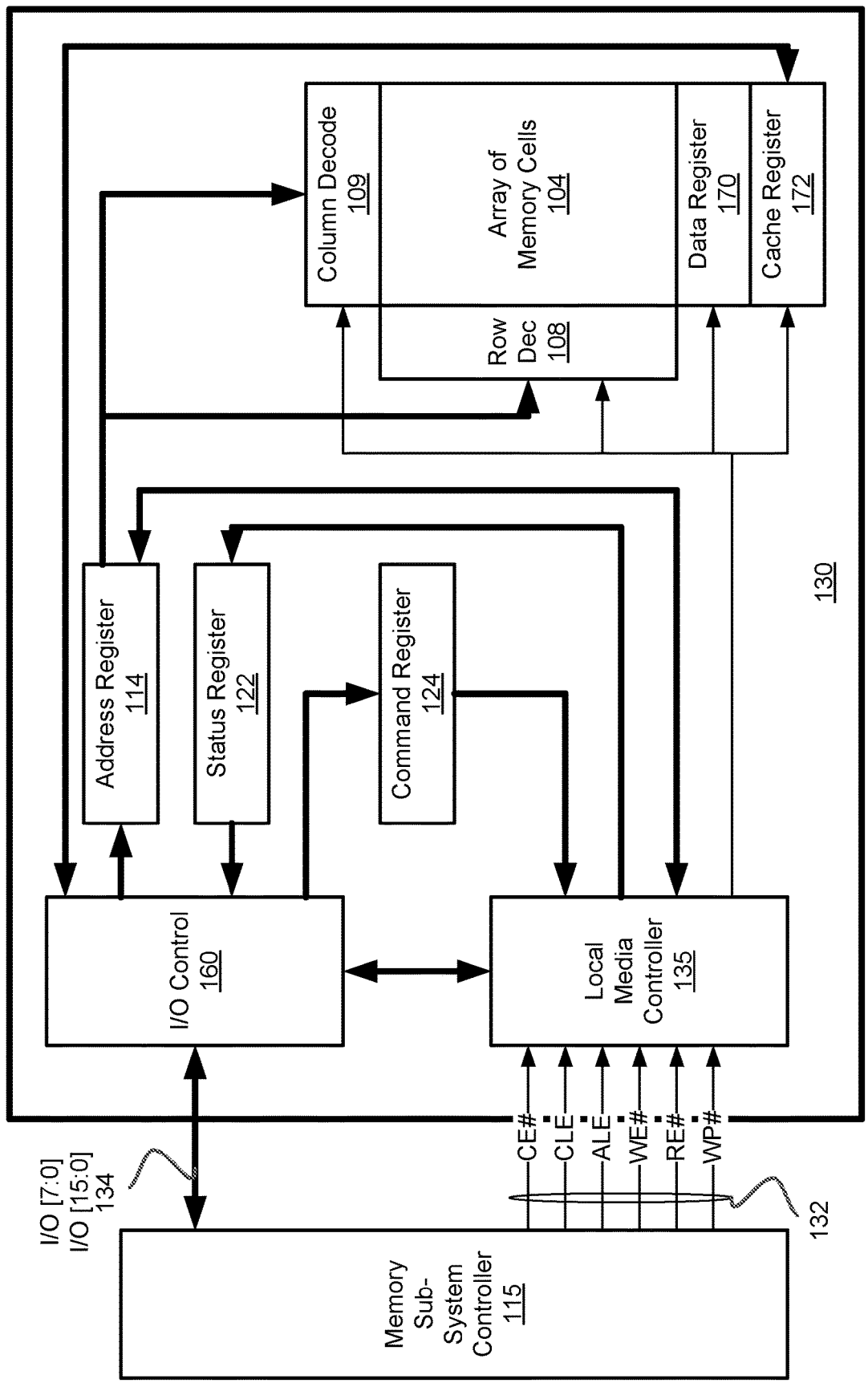
FIG. 1B is a block diagram of a memory device in communication with a memory sub-system controller of a memory sub-system, in accordance with some embodiments of the present disclosure.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device.

Memory device 130 includes an array of memory cells 104 logically arranged in rows and columns. Memory cells of a logical row are typically connected to the same access line (e.g., a wordline) while memory cells of a logical column are typically selectively connected to the same data line (e.g., a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two target data states.

Row decode circuitry 108 and column decode circuitry 109 are provided to decode address signals. Address signals are received and decoded to access the array of memory cells 104. Memory device 130 also includes input/output (I/O) control circuitry 160 to manage input of commands, addresses and data to the memory device 130 as well as output of data and status information from the memory device 130. An address register 114 is in communication with I/O control circuitry 160 and row decode circuitry 108 and column decode circuitry 109 to latch the address signals prior to decoding. A command register 124 is in communication with I/O control circuitry 160 and local media controller 135 to latch incoming commands.

A controller (e.g., the local media controller 135 internal to the memory device 130) controls access to the array of memory cells 104 in response to the commands and generates status information for the external memory sub-system controller 115, i.e., the local media controller 135 is configured to perform access operations (e.g., read operations, programming operations and/or erase operations) on the array of memory cells 104. The local media controller 135 is in communication with row decode circuitry 108 and column decode circuitry 109 to control the row decode circuitry 108 and column decode circuitry 109 in response to the addresses. In one embodiment, local media controller 135 can perform a double single-level cell (SLC) program operation to concurrently (i.e., at least partially overlapping in time) program memory cells in two or more separate sub-blocks of a block of memory array 104 using a single programming pulse.

The local media controller 135 is also in communication with a cache register 172. Cache register 172 latches data, either incoming or outgoing, as directed by the local media controller 135 to temporarily store data while the array of memory cells 104 is busy writing or reading, respectively, other data. During a program operation (e.g., write operation), data may be passed from the cache register 172 to the data register 170 for transfer to the array of memory cells 104; then new data may be latched in the cache register 172 from the I/O control circuitry 160. During a read operation, data may be passed from the cache register 172 to the I/O control circuitry 160 for output to the memory sub-system controller 115; then new data may be passed from the data register 170 to the cache register 172. The cache register 172 and/or the data register 170 may form (e.g., may form a portion of) a page buffer of the memory device 130. A page buffer may further include sensing devices (not shown in FIG. 1B) to sense a data state of a memory cell of the array of memory cells 104, e.g., by sensing a state of a data line connected to that memory cell. A status register 122 may be in communication with I/O control circuitry 160 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 134 and outputs data to the memory sub-system controller 115 over I/O bus 134.

For example, the commands may be received over input/output (I/O) pins [7:0] of I/O bus 134 at I/O control circuitry 160 and may then be written into command register 124. The addresses may be received over input/output (I/O) pins [7:0] of I/O bus 134 at I/O control circuitry 160 and may then be written into address register 114. The data may be received over input/output (I/O) pins [7:0] for an 8-bit device or input/output (I/O) pins [15:0] for a 16-bit device at I/O control circuitry 160 and then may be written into cache register 172. The data may be subsequently written into data register 170 for programming the array of memory cells 104.

In an embodiment, cache register 172 may be omitted, and the data may be written directly into data register 170. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2:
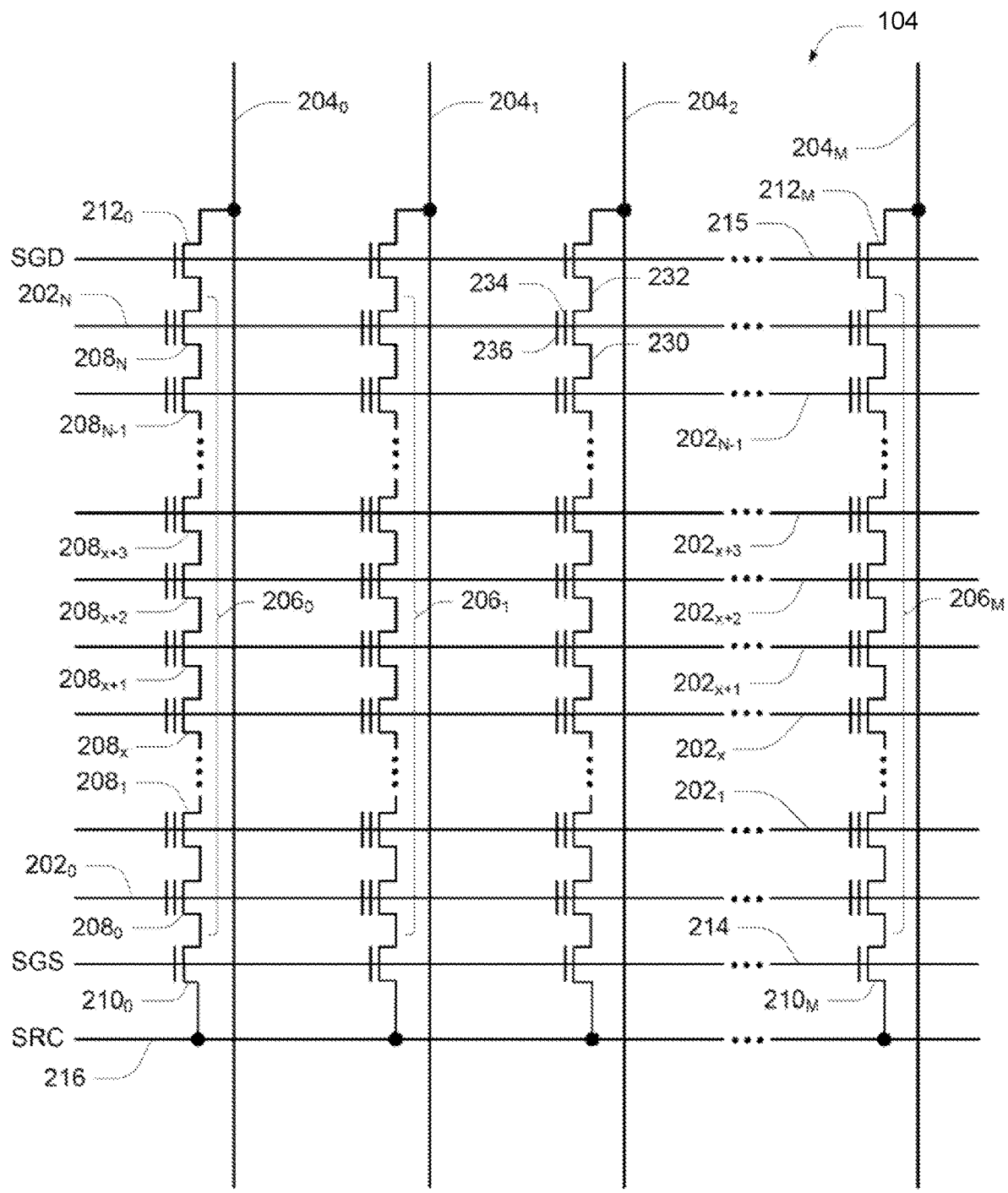
FIG. 2 is a schematic of portions of an array of memory cells as could be used in a memory of the type described with reference to FIG. 1B in accordance with some embodiments of the present disclosure.

FIG. 2 is a schematic of portions of an array of memory cells 104, such as a NAND memory array, as could be used in a memory of the type described with reference to FIG. 1B according to an embodiment. Memory array 104 includes access lines, such as wordlines $202_0$ to $202_N$, and data lines, such as bit lines $204_0$ to $204_M$. The wordlines 202 can be connected to global access lines (e.g., global wordlines), not shown in FIG. 2, in a many-to-one relationship. For some embodiments, memory array 104 can be formed over a semiconductor that, for example, can be conductively doped to have a conductivity type, such as a p-type conductivity, e.g., to form a p-well, or an n-type conductivity, e.g., to form an n-well.

Memory array 104 can be arranged in rows (each corresponding to a wordline 202) and columns (each corresponding to a bit line 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Select gates $210_0$ to $210_M$ can be commonly connected to a select line 214, such as a source select line (SGS), and select gates $212_0$ to $212_M$ can be commonly connected to a select line 215, such as a drain select line (SGD). Although depicted as traditional field-effect transistors, the select gates 210 and 212 can utilize a structure similar to (e.g., the same as) the memory cells 208 (e.g., metal-oxide-semiconductor field-effect transistor (MOSFET) structures such as silicon-oxide-nitride-oxide-silicon (SONOS) MOSFET structure). The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bit line 204 for the corresponding NAND string 206. For example, the drain of select gate $212_0$ can be connected to the bit line $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bit line 204. A control gate of each select gate 212 can be connected to select line 215.

The memory array 104 in FIG. 2 can be a quasi-two-dimensional memory array and can have a generally planar structure, e.g., where the common source 216, NAND strings 206 and bit lines 204 extend in substantially parallel planes. Alternatively, the memory array 104 in FIG. 2 can be a three-dimensional memory array, e.g., where NAND strings 206 can extend substantially perpendicular to a plane containing the common source 216 and to a plane containing the bit lines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bit line 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bit lines 204 (e.g., bit lines $204_0$, $204_2$, $204_4$, etc.) can be one physical page of the memory cells 208 (e.g., even memory cells) while memory cells 208 commonly connected to wordline $202_N$ and selectively connected to odd bit lines 204 (e.g., bit lines $204_1$, $204_3$, $204_5$, etc.) can be another physical page of the memory cells 208 (e.g., odd memory cells).

Although bit lines $204_3$-$204_5$ are not explicitly depicted in FIG. 2, it is apparent from the figure that the bit lines 204 of the array of memory cells 104 can be numbered consecutively from bit line $204_0$ to bit line $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2 is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

In one embodiment, memory device 130 includes local media controller 135 and a memory array 104. As described herein, local media controller 135 can perform a program operation on the memory cells (e.g., memory cells $208_0$ to $202_M$) of memory array 104. The program operation through bitline(s) $204_0$ to $204_M$ can be applied to any direction of program sequence along strings $206_0$ to $206_M$ or sub-blocks of memory cells (e.g., source to drain (S2D) or drain to source (D2S)). For example, in some embodiments, the program operation may be applied from source 230 to drain 232 or in the opposite direction (e.g., drain 232 to source 230). In further embodiments, the program operation may be applied from common source 216 to the drain of select gates(s) $212_0$ to $212_M$ or in the opposite direction from the drain of select gates(s) $212_0$ to $212_M$ to common source 216. A program operation can include, for example, a program phase and a program verify phase. During the program phase, a program voltage is applied to selected wordline(s) $202_0$ to $202_N$ of the memory array 104, in order to program certain level(s) of charge to selected memory cells coupled to wordline(s) $202_0$ to $202_N$ representative of a desired value(s). In one embodiment, by conditioning the channel potential associated with multiple sub-blocks according to a data pattern to be programmed to the memory cells contained therein before the program voltage is applied to one or more selected wordline(s) $202_0$ to $202_N$, multiple memory cells in separate sub-blocks can be accurately programmed using a single programming pulse.

For example, at the start of the program operation, local media controller 135 may cause a pass voltage to be applied to multiple wordlines (e.g., wordline(s) $202_0$ to $202_N$) of a block of memory array 104 in memory device 130. The block can include multiple sub-blocks, and the pass voltage can boost a channel potential of each of the multiple sub-blocks to a boost voltage (Vboost). Local media controller 135 can further selectively discharge the boost voltage from one or more of the multiple sub-blocks according to a data pattern representing a sequence of bits to be programmed to respective memory cells (e.g., memory cells $208_0$ to $202_M$) of those sub-blocks. This selective discharge can result in the channel potential of the sub-blocks containing memory cells to be programmed to discharge to a ground voltage. In addition, local media controller 135 may cause a single programming pulse to be applied to a selected wordline of the multiple wordlines $202_0$ to $202_N$ of the block to program the respective memory cells of the multiple sub-blocks according to the data pattern. In one embodiment, the memory cells in those sub-blocks for which the channel potential was discharged to ground will be programmed, while memory cells in those sub-blocks for which the channel potential was not discharged and remained at the boost voltage will be inhibited and not programmed. A program verify phase can then be initiated to verify that the memory cells were programmed correctly according to the data pattern.

Figure 3:
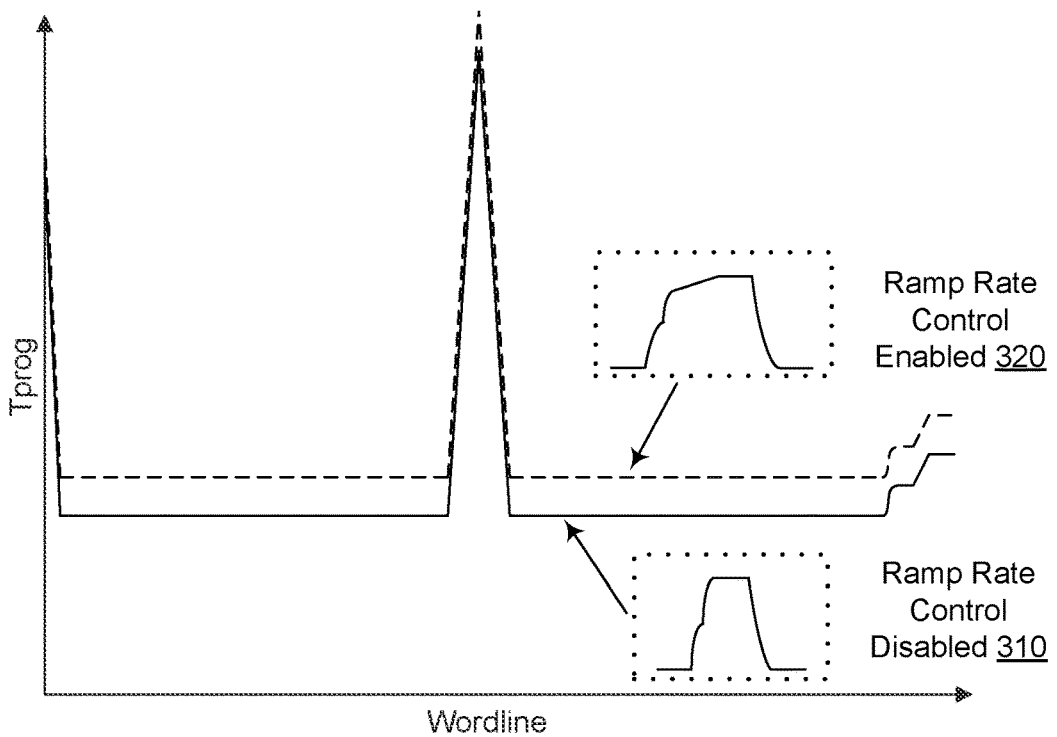
FIG. 3 is a graph illustrating performance when a ramp rate control of a program pulse is enabled or disabled for a wordline of a string of an array of memory cells in accordance with some embodiments of the present disclosure.

FIG. 3 is a graph illustrating performance (e.g., time to program (Tprog)) when a ramp rate control of a program pulse is in an enabled state 320 or a disabled state 310 for a wordline of a string of an array of memory cells, in accordance with some embodiments of the present disclosure. In some embodiments, the array of memory cells may be configured as SLC memory. In some embodiments, the ramp rate control disabled state 310 may correlate to no ramp rate control, a default ramp rate 410 described in FIG. 4, or to any ramp rate used at the BOL of a memory device. In some embodiments, the ramp rate control enabled state 320 may correlate to controlling the ramp rate, e.g., by controlling the ramp rate to be any of a first ramp rate 420, a second ramp rate 430, a third ramp rate 440, as illustrated in FIG. 4, or another controlled ramp rate not specifically illustrated.

In some embodiments, the controller 115 may enable or disable a ramp rate control, in response to a media endurance metric value satisfying a threshold criterion. In some embodiments, a threshold criterion may be a logical condition (e.g., a PEC value must be greater than or equal to a certain number of PECs (e.g., a PEC threshold value) for the threshold criterion to be satisfied). For example, a threshold value may be equal to a fixed number of PECs or another media endurance metric (e.g., a threshold value may be determined based on statistical data collected in post-production testing, such that the determined threshold value would optimize chosen performance or endurance metric(s)). In some embodiments, for example, the EOL for an SLC memory cell may be associated with a certain number of PECs. For example, the first threshold value may be a certain percentage of the EOL PECs. In some embodiments, threshold values may be determined by selecting threshold values, switching the WL ramp rate at each threshold value, checking the reliability at EOL PEC, and adjusting the threshold values according to a desired reliability profile. In some embodiments a ramp rate control may be enabled when, for example, a block reaches a number of PECs that is greater than or equal to a threshold criterion.

FIG. 4 is a graph of a program pulse 450 with different ramps rates for a wordline of a string of an array of memory cells, in accordance with some embodiments of the present disclosure. In some embodiments, the array of memory cells may be configured as SLC memory. "Ramp rate" refers to the rate of change of the voltage level of a program pulse. Ramp rate may be depicted in graphical form, as shown in FIG. 4, as the slope of the leading edge of a program pulse 450. Accordingly, a steeper slope corresponds to a greater ramping rate. The slope of a curve at a point on that curve may be determined by calculating the slope of the line tangent to the curve at that point. The average slope of a portion of a curve may be determined by calculating the slope between the two end points of that portion of the curve. In some embodiments, the ramp speed of a default ramp rate 410 is greater than a first ramp rate 420, the first ramp rate 420 is greater than a second ramp rate 430, and the second ramp rate 430 is greater than a third ramp rate 440. In some embodiments, the default ramp rate 410 can be the fastest ramp rate used at the beginning of life (BOL) of a memory device.

In some embodiments, the controller 115 may set the ramp rate of programming voltage pulses applied to a block to the default ramp rate if the media endurance metric value of the block does not satisfy a threshold criterion. In these embodiments, the threshold criterion may be based on a threshold value (e.g., a fixed PEC value, write amplification, and/or the like). For example, a threshold value may be equal to a fixed number of PECs or another media endurance metric (e.g., a threshold value may be determined based on statistical data collected in post-production testing, such that the determined threshold value would optimize chosen performance or endurance metric(s)). In these and other embodiments, a threshold criterion is satisfied if the media endurance metric value is greater than (or greater than or equal to) the threshold value. In these and other embodiments, a threshold criterion is not satisfied when the media endurance metric value is less than the threshold value. In some embodiments, the threshold value and media endurance metric value may include an indication of a relative value between the two values (e.g., the media endurance metric value being less than the threshold value by a percentage).

In some embodiments, the controller 115 may cause the worldline ramp rate to be set to the first ramp rate 420 when the media endurance metric value of the block satisfies the first threshold criterion. "Ramp rate" refers to the rate of change of the voltage level of a program pulse. In some embodiments, controlling of the wordline ramp rate may be done in stages (e.g., multiple threshold criteria correlating to multiple ramp rates of different levels of granularity). In some embodiments, ramp rate may be determined or affected by trim parameters in a NAND component such as T_tz_step_wait and tz_step. T_tz_step_wait may control the length of time for each tz_step (amplitude of step). In some embodiments, adjusting these parameters may control the slope of the ramp rate. In some embodiments, a ramp rate may be determined based on statistical data collected in post-production testing, such that the determined ramp rate would optimize chosen performance or endurance metric(s).

Figure 5:
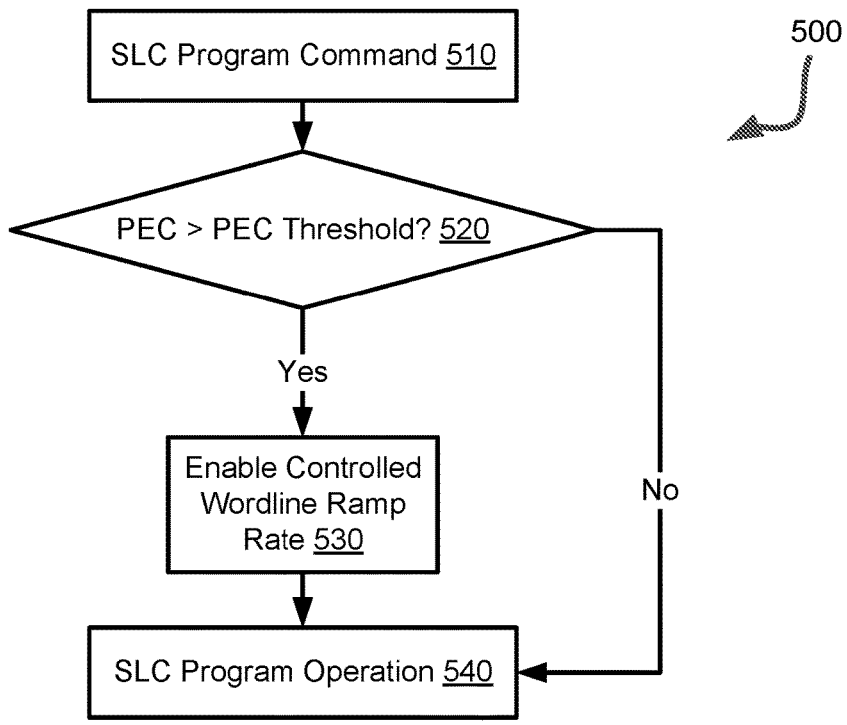
FIG. 5 is a flow diagram of an example method of performing single-level cell (SLC) programming with an adaptive wordline ramp rate, in accordance with embodiments of the present disclosure.

FIG. 5 is a flow diagram of an example method 500 of performing SLC programming with an adaptive wordline ramp rate, in accordance with embodiments of the present disclosure. The method 500 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is performed by the local media controller 135 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

In some embodiments, at operation 510 an SLC program command may be given by the memory subsystem controller 115.

At operation 520, the processing logic determines that a media endurance metric value (e.g., PEC value) satisfies a threshold criterion. Alternatively, the processing logic may determine that the media endurance metric value does not satisfy the threshold criterion and, in response to determining that the media endurance metric value does not satisfy the threshold criterion, the method continues to the SLC program operation 540. In some embodiments, the threshold criterion may be a media endurance metric threshold value such as a PEC threshold value, write amplification, or a combination thereof.

At operation 530, the processing logic, in response to the determining, enables a controlled wordline ramp rate (e.g., ramp rate control enabled state 320).

At operation 540, the processing logic executes the SLC program command and completes a corresponding SLC program operation.

Figure 6A:
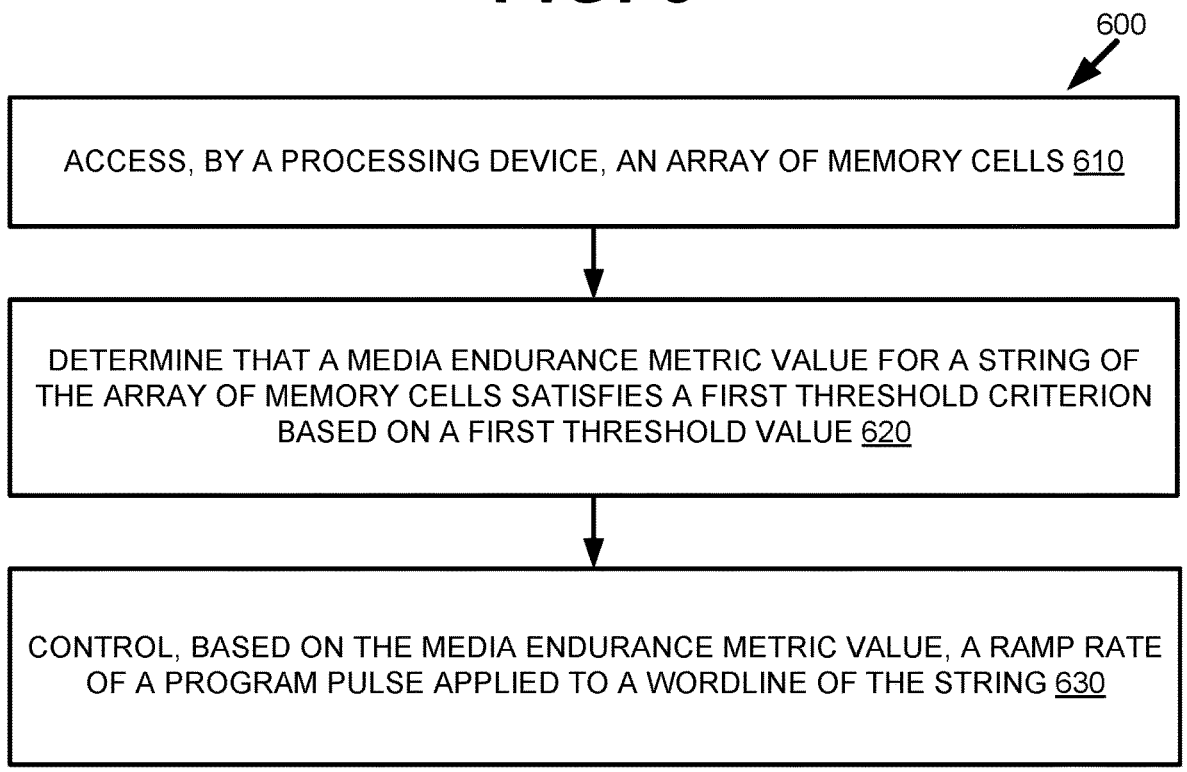
FIG. 6A is a flow diagram of an example method of performing memory cell programming with an adaptive wordline ramp rate, in accordance with embodiments of the present disclosure.

FIG. 6A is a flow diagram of an example method 600 of performing memory cell programming with an adaptive wordline ramp rate, in accordance with embodiments of the present disclosure. The method 600 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 600 is performed by the local media controller 135 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 610 a processing device accesses an array of memory cells. This array of memory cells may be the array of memory cells 104 discussed with reference to FIGS. 1A-1B. In some embodiments, the array of memory cells may be configured as SLC memory.

At operation 620, the processing logic determines that a media endurance metric value for a string of the array of memory cells satisfies a first threshold criterion based on a first threshold value. In some embodiments, the processing logic tracks the media endurance metric value over time as a PEC value, write amplification, or a combination thereof.

At operation 630, the processing logic controls a ramp rate of a program pulse applied to a wordline of the string based on the media endurance metric value. In some embodiments, the processing logic determines that the media metric value does not satisfy the first threshold criterion and in response to determining that the media metric value does not satisfy the first threshold criterion, the processing logic sets the ramp rate to a default ramp rate (e.g., default ramp rate 410). In some embodiments, the controlling may comprise setting the ramp rate according to a difference between the threshold value (e.g., the first threshold value) and the media endurance metric value.

Figure 6B:
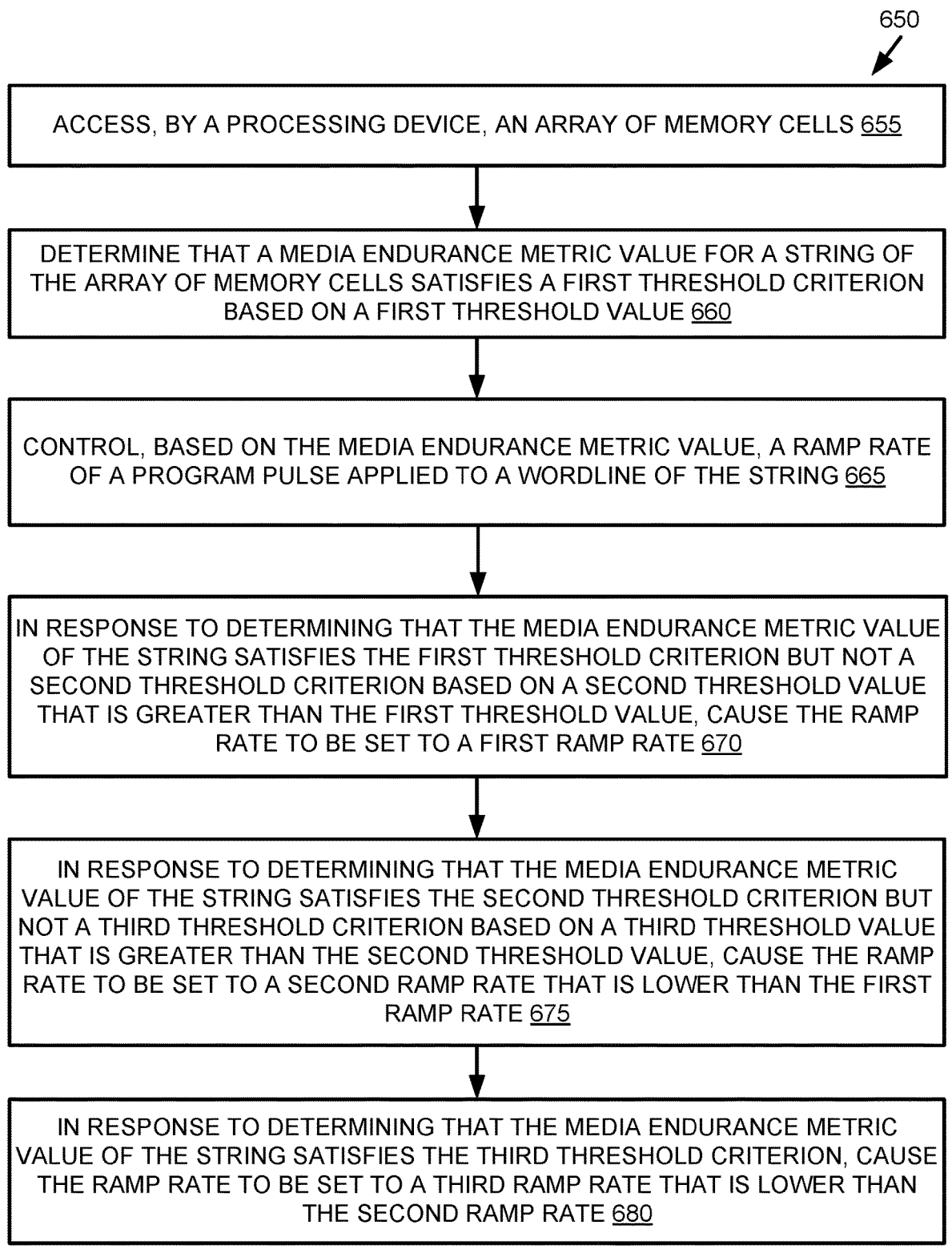
FIG. 6B is a flow diagram of an example method of performing memory cell programming with an adaptive wordline ramp rate, in accordance with embodiments of the present disclosure.

FIG. 6B is a flow diagram of an example method 650 of performing memory cell programming with an adaptive wordline ramp rate, in accordance with embodiments of the present disclosure. The method 650 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 650 is performed by the local media controller 135 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 655 a processing device accesses an array of memory cells. This array of memory cells may be the array of memory cells discussed with reference to FIGS. 1A-1B. In some embodiments, the array of memory cells may be configured as SLC memory.

At operation 660 the processing logic determines that a media endurance metric value (e.g., PEC value) for a string of the array of memory cells satisfies a first threshold criterion based on a first threshold value.

At operation 665, the processing logic controls a ramp rate of a program pulse applied to a wordline of the string based on the media endurance metric value.

At operation 670, in response to the determining that the media endurance metric value of the string satisfies the first threshold criterion but not a second threshold criterion based on a second threshold value that is greater than the first threshold value, the processing logic causes the ramp rate to be set to a first ramp rate (e.g., first ramp rate 420).

At operation 675, in response to determining that the media endurance metric value of the string satisfies the second threshold criterion but not a third threshold criterion based on a third threshold value that is greater than the second threshold value, the processing logic causes the ramp rate to be set to a second ramp rate (e.g., second ramp rate 430) that is lower than the first ramp rate.

At operation 680, in response to determining that the media endurance metric value of the string satisfies the third threshold criterion, the processing logic causes the ramp rate to be set to a third ramp rate (third ramp rate 440) that is lower than the second ramp rate.

In some embodiments, the threshold criteria may comprise more than the first threshold criterion, the second threshold criterion, and the third threshold criterion. For example, there may be a fourth threshold criterion, a fifth threshold criterion, and a sixth threshold criterion, or any number of threshold criteria. In some embodiments, the threshold values may comprise more than the first threshold value, the second threshold value, and the third threshold value. For example, there may be a fourth threshold value, a fifth threshold value, and a sixth threshold value, or any number of threshold values. In further embodiments, the ramp rates may include more than the default ramp rate 410, the first ramp rate 420, the second ramp rate 430, and the third ramp rate 440. For example, there may be a fourth ramp rate, a fifth ramp rate, and a sixth ramp rate, or any number of ramp rates. In some embodiments, these further threshold criteria, threshold values, and ramp rates may correspond to each other, and the ramp rate may be controlled based on a determining that the media endurance metric value of the string satisfies one of the threshold criteria.

In some embodiments, the threshold values may be determined based on statistical data collected in post-production testing, such that the determined threshold values would optimize chosen performance or endurance metric(s).

In some embodiments, a multi-stage control of wordline ramp rates may be implemented. One embodiment is described in Table 1 below. Referring to Table 1, threshold value 1 is less than threshold value 2; threshold value 2 is less than threshold value 3; and threshold value 3 is less than threshold value 4. In some embodiments, threshold criterion 1 is based on threshold value 1, threshold criterion 2 is based on threshold value 2, threshold criterion 3 is based on threshold value 3, and threshold criterion 4 is based on threshold value 4. In further reference to Table 1, default ramp rate 410 is higher than first ramp rate 420; first ramp rate 420 is higher than second ramp rate 430; and second ramp rate 430 is higher than third ramp rate 440.

TABLE 1

| Media Endurance Metric Value | Wordline Ramp Rate |
|---|---|
| Media Endurance Metric Value ≤ Threshold Value 1 | Threshold Criterion 1 is not satisfied Default Ramp Rate 410 |
| Threshold Value 1 ≤ Media Endurance Metric Value ≤ Threshold Value 2 | Threshold Criterion 1 is satisfied First Ramp Rate 420 |
| Threshold Value 2 ≤ Media Endurance Metric Value ≤ Threshold Value 3 | Threshold Criterion 2 is satisfied Second Ramp Rate 430 |
| Threshold Value 3 ≤ Media Endurance Metric Value ≤ Threshold Value 4 | Threshold Criterion 3 is satisfied Third Ramp Rate 440 |

In some embodiments, to satisfy a threshold criterion a media endurance metric value may be greater than or equal to the threshold value that the threshold criterion is based on. In some embodiments, to satisfy the threshold criterion the media endurance metric value may be greater than the threshold value that the threshold criterion is based on.

Figure 7A:
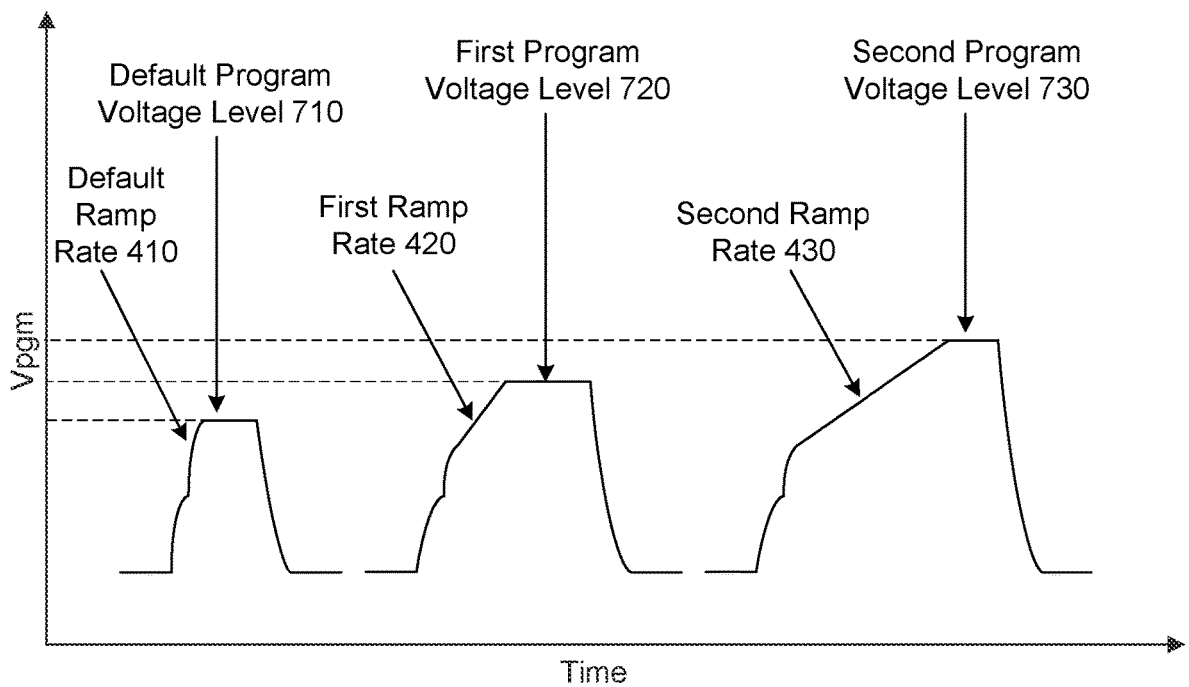
FIG. 7A is a graph of program pulses with different program voltage levels and ramps rates for a wordline of a string of an array of memory cells, in accordance with some embodiments of the present disclosure.

FIG. 7A is a graph of program pulses with different program voltage levels (e.g., voltage amplitudes of the program pulse) and ramps rates for a wordline of a string of an array of memory cells, in accordance with some embodiments of the present disclosure. In some embodiments, the array of memory cells may be configured as SLC memory. Ramp rate may be depicted in graphical form, as shown in FIG. 7A, as the slope of the leading edge of a program pulse 450. Accordingly, a steeper slope corresponds to a greater ramping rate. The slope of a curve at a point on the curve may be determined by calculating the slope of the line tangent to the curve at that point. The average slope of a portion of a curve may be determined by calculating the slope between the two end points of that portion of the curve. In some embodiments, the ramp speed of the default ramp rate 410 is greater than the ramp speed of the first ramp rate 420, and the ramp speed of the first ramp rate 420 is greater than the ramp speed of the second ramp rate 430. In some embodiments, the default ramp rate 410 is the fastest ramp rate (greatest ramp speed) used at the BOL of a memory device.

In some embodiments, the controller 115 may set the voltage of a program pulse to a default program voltage level when the media endurance metric value of the block does not satisfy a threshold criterion. In these embodiments, the threshold criterion may be a fixed PEC value, write amplification, and/or the like. In some embodiments, the program voltage is the maximum voltage level of the program pulse and is referred to herein as the voltage of the program pulse. In some embodiments, a default program voltage level 710 is less than a first program voltage level 720, and first program voltage level 720 is less than a second program voltage level 730. In some embodiments default program voltage level 710 is the lowest program voltage level used at the BOL of a memory device.

In some embodiments, the threshold criteria may comprise more than the first threshold criterion, the second threshold criterion, and the third threshold criterion. For example, there may be a fourth threshold criterion, a fifth threshold criterion, and a sixth threshold criterion, or any number of threshold criteria. In some embodiments, the threshold values may comprise more than the first threshold value, the second threshold value, and the third threshold value. For example, there may be a fourth threshold value, a fifth threshold value, and a sixth threshold value, or any number of threshold values. In some embodiments, the ramp rates may comprise more than the default ramp rate 410, the first ramp rate 420, and the second ramp rate 430. Further embodiments may include, for example, a third ramp rate, a fourth ramp rate, or any number of ramp rates. In some embodiments, the program voltage levels may comprise more than the default program voltage level 710, the first program voltage level 720, and the second program voltage level 730. Further embodiments may include, for example, a third program voltage level, a fourth program voltage level, a fifth program voltage level, or any number of program voltage levels. In some embodiments, these further threshold criteria, threshold values, ramps rates, and program voltage levels may correspond to each other, and the program voltage level may be controlled based on a determining that the media endurance metric value of the string satisfies at least one of the threshold criteria.

In some embodiments, the threshold values may be determined based on statistical data collected in post-production testing, such that the determined threshold values would optimize chosen performance or endurance metric(s). In some embodiments, a voltage level may be determined based on statistical data collected in post-production testing, such that the determined voltage level would optimize chosen performance or endurance metric(s). In some embodiments, for example, there may be a target voltage level for an SLC program state. In some embodiments, measurements may be taken under different PEC values to determine if the voltage level is sufficient to achieve a target voltage distribution.

Figure 7B:
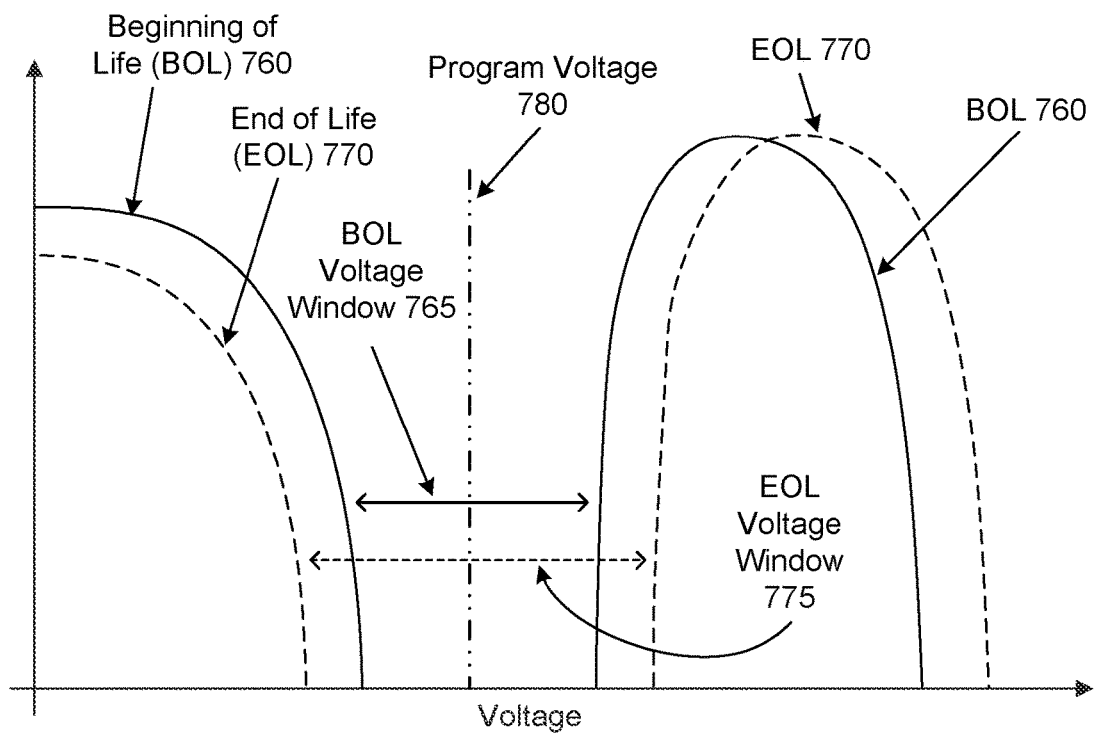
FIG. 7B is a graph of voltage window expansion of a program pulse with different program voltage levels for a wordline of a string of an array of memory cells, in accordance with some embodiments of the present disclosure.

FIG. 7B is a graph of voltage window expansion of a program pulse with different program voltage levels (e.g., voltages of the program pulse) for a wordline of a string of an array of memory cells, in accordance with some embodiments of the present disclosure. In some embodiments, the array of memory cells may be configured as SLC memory. In some embodiments, a voltage window (e.g., BOL voltage window 765) is broadened at the EOL 770 of a memory device. For example, a BOL voltage window 765 may be less than an EOL voltage window 775. In one embodiment, at the BOL 760 of a memory device the voltage of the program pulse is low (e.g., program voltage 780 is low), and the ramp rate is high. Then, at the EOL 770 of the memory device, the voltage of the program pulse (e.g., program voltage 780) increases (e.g., BOL voltage window 765 expands to EOL voltage window 775), and the ramp rate decreases.

Figure 8:
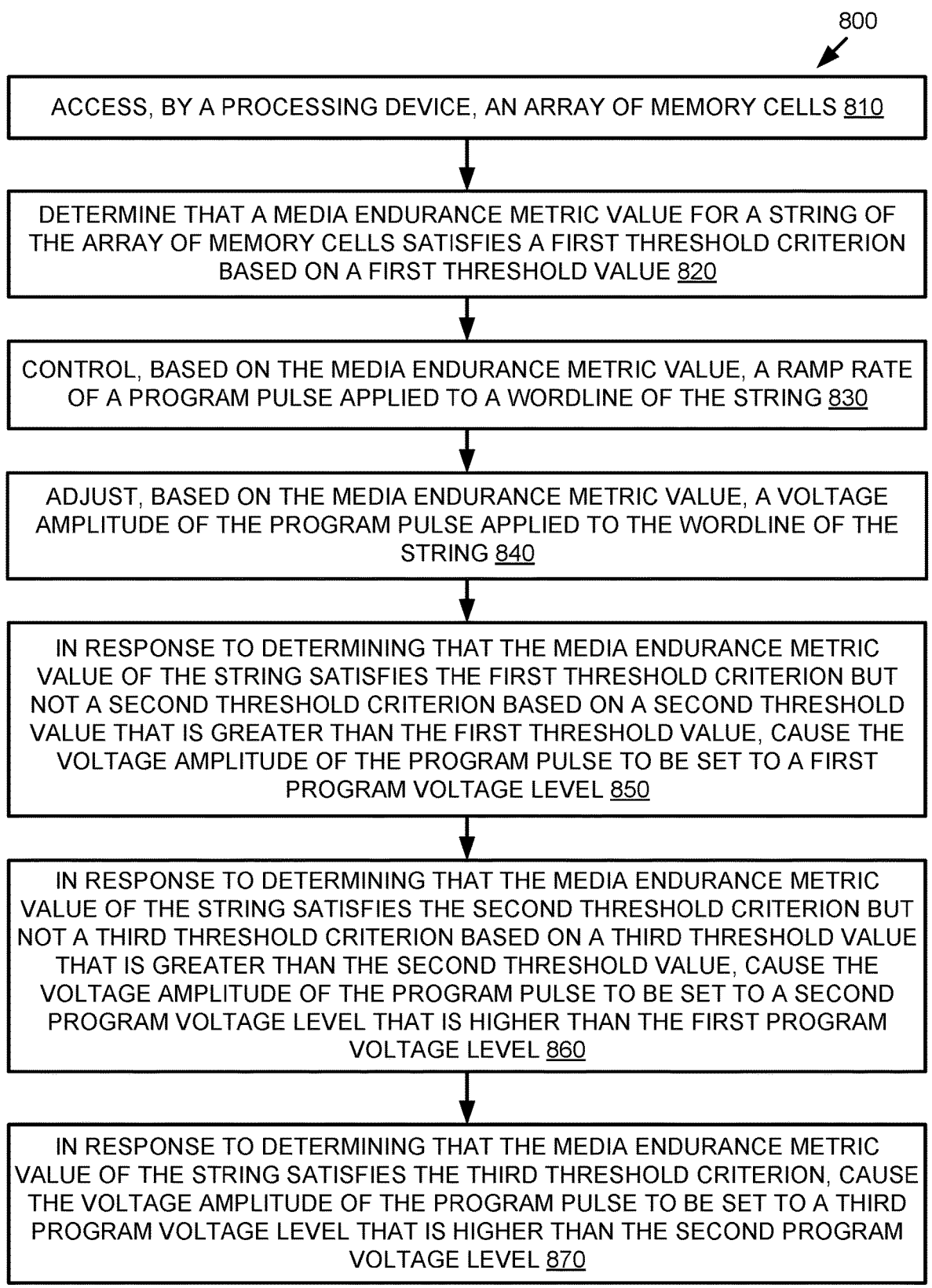
FIG. 8 is a flow diagram of an example method of performing memory cell programming with different program voltage levels and ramps rates for a wordline of a string of an array of memory cells, in accordance with some embodiments of the present disclosure.

FIG. 8 is a flow diagram of an example method 800 of performing memory cell programming with different program voltage levels (e.g., voltages of the program pulse) and ramps rates for a wordline of a string of an array of memory cells, in accordance with some embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by the local media controller 135 of FIGS. 1A-1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, a processing logic accesses an array of memory cells. This array of memory cells may be the array of memory cells discussed with reference to FIGS. 1A-1B. In some embodiments, the array of memory cells may be configured as SLC memory.

At operation 820, the processing logic determines that a media endurance metric value (e.g., PEC value) for a string of the array of memory cells satisfies a first threshold criterion based on a first threshold value.

At operation 830, the processing logic controls a ramp rate of a program pulse applied to a wordline of the string based on the media endurance metric value.

At operation 840, the processing logic adjusts a voltage of a program pulse applied to the wordline of the string based on the media endurance metric value.

At operation 850, in response to the determining that the media endurance metric value of the string satisfies the first threshold criterion but not a second threshold criterion based on a second threshold value that is greater than the first threshold value, the processing logic causes the voltage of the program pulse (e.g., program voltage level) to be set to a first program voltage level (e.g., first program voltage level 720).

At operation 860, in response to determining that the media endurance metric value (e.g., PEC value) of the string satisfies the second threshold criterion but not a third threshold criterion based on a third threshold value that is greater than the second threshold value, the processing logic causes the voltage of the program pulse (e.g., program voltage level) to be set to a second program voltage level (e.g., second program voltage level 730) that is higher than the first program voltage level.

At operation 870, in response to determining that the media endurance metric value of the string satisfies the third threshold criterion, the processing logic causes the voltage of the program pulse (e.g., program voltage level) to be set to a third program voltage level (not shown in FIG. 7A) that is higher than the second program voltage level. In some embodiments, the increasing of the voltage of the program pulse (e.g., program voltage) may be according to a difference between the threshold value (e.g., the first threshold value) and the media endurance metric value (e.g., PEC value).

In some embodiments, the threshold criteria may comprise more than the first threshold criterion, the second threshold criterion, and the third threshold criterion. For example, there may be a fourth threshold criterion, a fifth threshold criterion, and a sixth threshold criterion, or any number of threshold criteria. In some embodiments, the threshold values may comprise more than the first threshold value, the second threshold value, and the third threshold value. For example, there may be a fourth threshold value, a fifth threshold value, and a sixth threshold value, or any number of threshold values. In some embodiments, the ramp rates may comprise more than the default ramp rate 410, the first ramp rate 420, and the second ramp rate 430. Further embodiments may include, for example, a third ramp rate 440, a fourth ramp rate, or any number of ramp rates. In some embodiments, the program voltage levels (e.g., voltage levels of the program pulse) may comprise more than the default program voltage level 710, the first program voltage level 720, and the second program voltage level 730. Further embodiments may include, for example, a third program voltage level, a fourth program voltage level, a fifth program voltage level, or any number of program voltage levels. In some embodiments, these further threshold criteria, threshold values, ramp rates, and program voltage levels may correspond to each other, and the program voltage level may be controlled based on a determining that the media endurance metric value (e.g., PEC value) of the string satisfies one of the threshold criteria.

In some embodiments, the threshold values may be determined based on statistical data collected in post-production testing, such that the determined threshold values would optimize chosen performance or endurance metric(s).

In some embodiments, a multi-stage control of program voltage level may be implemented. One embodiment is described in Table 2 below. Referring to Table 2, threshold value 1 is less than threshold value 2; threshold value 2 is less than threshold value 3; and threshold value 3 is less than threshold value 4. In some embodiments, threshold criterion 1 is based on threshold value 1, threshold criterion 2 is based on threshold value 2, threshold criterion 3 is based on threshold value 3, and threshold criterion 4 is based on threshold value 4. In further reference to Table 2, default program voltage level 710 is lower than first program voltage level 720; first program voltage level 720 is lower than second program voltage level 730; and second program voltage level 730 is lower than the third program voltage level (not shown in FIG. 7A).

TABLE 2

| Media Endurance Metric Value | Program Voltage Level (e.g., voltage of the program pulse) |
| --- | --- |
| Media Endurance Metric Value ≤ Threshold Value 1 | Threshold Criterion 1 is not satisfied Default Program Voltage Level 710 |
| Threshold Value 1 ≤ Media Endurance Metric Value ≤ Threshold Value 2 | Threshold Criterion 1 is satisfied First Program Voltage Level 720 |
| Threshold Value 2 ≤ Media Endurance Metric Value ≤ Threshold Value 3 | Threshold Criterion 2 is satisfied Second Program Voltage Level 730 |
| Threshold Value 3 ≤ Media Endurance Metric Value ≤ Threshold Value 4 | Threshold Criterion 3 is satisfied Third Program Voltage Level (not shown in FIG. 7A) |

In some embodiments, to satisfy a threshold criterion a media endurance metric value may be greater than or equal to the threshold value that the threshold criterion is based on. In some embodiments, to satisfy the threshold criterion the media endurance metric value may be greater than the threshold value that the threshold criterion is based on.

Figure 9:
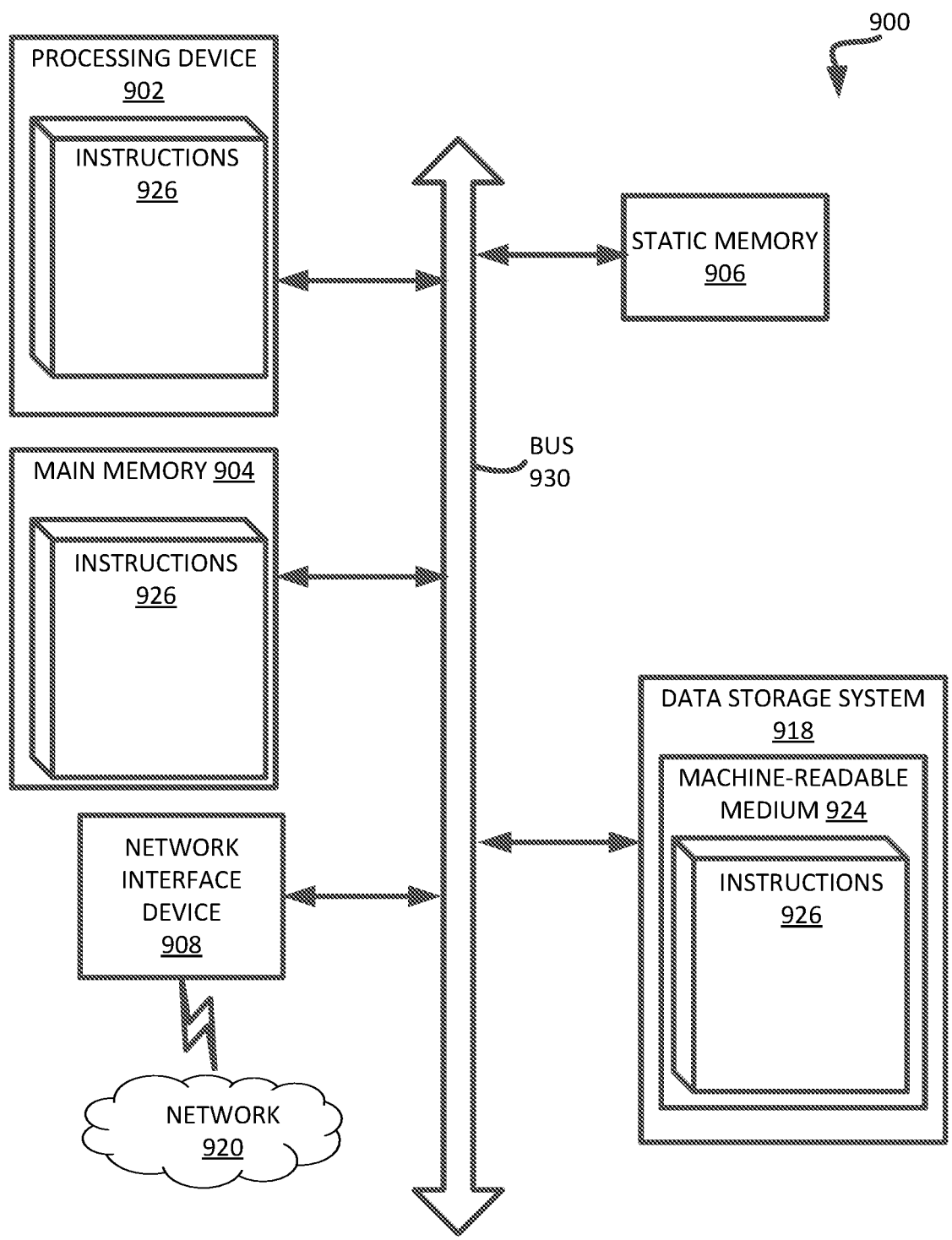
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the local media controller 135 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIG. 1.

In one embodiment, the instructions 926 include instructions to implement functionality corresponding to the local media controller 135 of FIG. 1). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
an array of memory cells; and
a processing device operatively coupled to the array of memory cells, the processing device to perform operations comprising:
determining that a media endurance metric value for a string of the array of memory cells satisfies a first threshold criterion based on a first threshold value; and
controlling, based on the media endurance metric value, a ramp rate of a program pulse applied to a wordline of the string.

2. The system of claim 1, wherein the operations further comprise:
determining that the media endurance metric value does not satisfy the first threshold criterion; and
in response to determining that the media endurance metric value does not satisfy the first threshold criterion, setting the ramp rate to a default ramp rate.

3. The system of claim 1, wherein the controlling comprises setting the ramp rate according to a difference between the first threshold value and the media endurance metric value.

4. The system of claim 1, wherein the determining comprises tracking the media endurance metric value over time as a program/erase cycle (PEC) value.

5. The system of claim 1, wherein the array of memory cells is configured as single-level cell (SLC) memory.

6. The system of claim 1, wherein the controlling comprises:
in response to determining that the media endurance metric value of the string satisfies the first threshold criterion but not a second threshold criterion based on a second threshold value that is greater than the first threshold value, causing the ramp rate to be set to a first ramp rate;
in response to determining that the media endurance metric value of the string satisfies the second threshold criterion but not a third threshold criterion based on a third threshold value that is greater than the second threshold value, causing the ramp rate to be set to a second ramp rate that is lower than the first ramp rate; and in response to determining that the media endurance metric value of the string satisfies the third threshold criterion, causing the ramp rate to be set to a third ramp rate that is lower than the second ramp rate.

7. The system of claim 1, wherein the operations further comprise adjusting, based on the media endurance metric value, a voltage of the program pulse applied to the wordline of the string.

8. The system of claim 7, wherein the adjusting comprises setting the voltage of the program pulse according to a difference between the first threshold value and the media endurance metric value.

9. The system of claim 7, wherein the adjusting comprises:
in response to determining that the media endurance metric value of the string satisfies the first threshold criterion but not a second threshold criterion based on a second threshold value that is greater than the first threshold value, causing the voltage of the program pulse to be set to a first program voltage level;
in response to determining that the media endurance metric value of the string satisfies the second threshold criterion but not a third threshold criterion based on a third threshold value that is greater than the second threshold value, causing the voltage of the program pulse to be set to a second program voltage level that is higher than the first program voltage level; and
in response to determining that the media endurance metric value of the string satisfies the third threshold criterion, causing the voltage of the program pulse to be set to a third program voltage level that is higher than the second program voltage level.

10. A method comprising:
accessing, by a processing device, an array of memory cells;
determining that a media endurance metric value for a string of the array of memory cells satisfies a first threshold criterion based on a first threshold value; and
controlling, based on the media endurance metric value, a ramp rate of a program pulse applied to a wordline of the string.

11. The method of claim 10, further comprising:
determining that the media endurance metric value does not satisfy the first threshold criterion; and
in response to determining that the media endurance metric value does not satisfy the first threshold criterion, setting the ramp rate to a default ramp rate.

12. The method of claim 10, wherein the controlling comprises setting the ramp rate according to a difference between the first threshold value and the media endurance metric value.

13. The method of claim 10, wherein the determining comprises tracking the media endurance metric value over time as a PEC value.

14. The method of claim 10, wherein the array of memory cells is configured as SLC memory.

15. The method of claim 10, wherein the controlling comprises:
in response to determining that the media endurance metric value of the string satisfies the first threshold criterion but not a second threshold criterion based on a second threshold value that is greater than the first threshold value, causing the ramp rate to be set to a first ramp rate;
in response to determining that the media endurance metric value of the string satisfies the second threshold criterion but not a third threshold criterion based on a third threshold value that is greater than the second threshold value, causing the ramp rate to be set to a second ramp rate that is lower than the first ramp rate; and
in response to determining that the media endurance metric value of the string satisfies the third threshold criterion, causing the ramp rate to be set to a third ramp rate that is lower than the second ramp rate.

16. The method of claim 10, further comprising adjusting, based on the media endurance metric value, a voltage of the program pulse applied to the wordline of the string.

17. The method of claim 16, wherein the adjusting comprises setting the voltage of the program pulse according to a difference between the first threshold value and the media endurance metric value.

18. The method of claim 16, wherein the adjusting comprises:
in response to determining that the media endurance metric value of the string satisfies the first threshold criterion but not a second threshold criterion based on a second threshold value that is greater than the first threshold value, causing the voltage of the program pulse to be set to a first program voltage level;
in response to determining that the media endurance metric value of the string satisfies the second threshold criterion but not a third threshold criterion based on a third threshold value that is greater than the second threshold value, causing the voltage of the program pulse to be set to a second program voltage level that is higher than the first program voltage level; and
in response to determining that the media endurance metric value of the string satisfies the third threshold criterion, causing the voltage of the program pulse to be set to a third program voltage level that is higher than the second program voltage level.

19. A non-transitory computer-readable storage medium storing instructions, which when executed by a processing device coupled to an array of memory cells, cause the processing device to perform operations comprising:
determining a media endurance metric value for a string of the array of memory cells;
in response to the determining that the media endurance metric value satisfies a first threshold criterion, controlling, based on the media endurance metric value, a ramp rate of a program pulse applied to a wordline of the string; and
in response to determining that the media endurance metric value does not satisfy the first threshold criterion, setting the ramp rate to a default ramp rate.

20. The non-transitory computer-readable storage medium of claim 19, wherein the controlling comprises:
in response to determining that the media endurance metric value of the string satisfies the first threshold criterion based on a first threshold value but not a second threshold criterion based on a second threshold value that is greater than the first threshold value, causing the ramp rate to be set to a first ramp rate;
in response to determining that the media endurance metric value of the string satisfies the second threshold criterion but not a third threshold criterion based on a third threshold value that is greater than the second threshold value, causing the ramp rate to be set to a second ramp rate that is lower than the first ramp rate; and in response to determining that the media endurance metric value of the string satisfies the third threshold criterion, causing the ramp rate to be set to a third ramp rate that is lower than the second ramp rate.

\* \* \* \* \*